United States Patent
Park et al.

(10) Patent No.: US 12,428,595 B2
(45) Date of Patent: Sep. 30, 2025

(54) OPTOELECTRONIC SYNAPTIC DEVICE INCLUDING QUANTUM DOT(QD)-TRANSITION METAL CHALCOGENIDE(TMD) HETEROJUNCTION

(71) Applicant: INDUSTRY-ACADEMIC COOPERATION FOUNDATION GYEONGSANG NATIONAL UNIVERSITY, Jinju-si (KR)

(72) Inventors: Jun Hong Park, Jinju-si (KR); Hyeong Tae Kim, Changwon-si (KR)

(73) Assignee: INDUSTRY-ACADEMIC COOPERATION FOUNDATION GYEONGSANG NATIONAL UNIVERSITY, Jinju-si (KR)

( * ) Notice: Subject to any disclaimer, the term of this patent is extended or adjusted under 35 U.S.C. 154(b) by 0 days.

(21) Appl. No.: 18/804,518

(22) Filed: Aug. 14, 2024

(65) Prior Publication Data
US 2025/0145884 A1    May 8, 2025

(30) Foreign Application Priority Data
Nov. 6, 2023  (KR) .................. 10-2023-0151914

(51) Int. Cl.
*C09K 11/02* (2006.01)
*B82Y 20/00* (2011.01)
(Continued)

(52) U.S. Cl.
CPC .......... *C09K 11/025* (2013.01); *C01B 19/007* (2013.01); *C09K 11/7492* (2013.01);
(Continued)

(58) Field of Classification Search
CPC ............ H01L 31/035218; H01L 31/1129
See application file for complete search history.

(56) References Cited

U.S. PATENT DOCUMENTS

2014/0374699 A1    12/2014  Cho et al.
2018/0315883 A1*   11/2018  Bessonov ............. H01L 31/173

FOREIGN PATENT DOCUMENTS

CN      116156976 A      5/2023
JP      2020-526933 A    8/2020
KR      10-2020-0140686 A    12/2020

OTHER PUBLICATIONS

Chao Hu et al., "Synergistic Effect of Hybrid PbS Quantum Dots/2D-WSe2 Toward High Performance and Broadband Phototransistors", Advanced Science News, Advanced Functional Materials, 2017, 17, 1603605.
(Continued)

*Primary Examiner* — Matthew L Reames
(74) *Attorney, Agent, or Firm* — Bridgeway IP Law Group, PLLC; Jihun Kim

(57) ABSTRACT

As the optoelectronic synaptic device according to a preferred embodiment includes a photoactive layer in which a heterojunction is formed as inorganic quantum dots that accept a near-infrared light signal directly contacts a transition metal dichalcogenide as a two-dimensional semiconductor material that exhibits synaptic characteristics, there is an effect of making a synaptic response to an optical signal in the near-infrared wavelength range. Therefore, as a function of simulating the human visual-brain function, which shows the neuromorphic characteristics by the photo response (visual response) of the infrared wavelength, together with light detection characteristics sensitively and rapidly responding to an infrared wavelength signal as well as a visible light signal, can be implemented in a single device for the sake of accurate recognition of objects, it can be easily applied in the autonomous driving mobility field.

12 Claims, 16 Drawing Sheets

(51) Int. Cl.
- B82Y 40/00 (2011.01)
- C01B 19/00 (2006.01)
- C09K 11/74 (2006.01)
- H10F 30/28 (2025.01)
- H10F 71/00 (2025.01)
- H10F 77/12 (2025.01)
- H10F 77/14 (2025.01)

(52) U.S. Cl.
CPC .......... *H10F 30/2877* (2025.01); *H10F 71/00* (2025.01); *H10F 77/12* (2025.01); *H10F 77/1433* (2025.01); *B82Y 20/00* (2013.01); *B82Y 40/00* (2013.01); *C01P 2004/24* (2013.01); *C01P 2006/40* (2013.01)

(56) References Cited

OTHER PUBLICATIONS

Biswajit Kundu et al., "Hybrid 2D-QD MoS2—PbSe Quantum Dot Broadband Photodetectors with High-Sensitivity and Room-Temperature Operation at 2.5 μm", Advnaced Optical Materials, 2021, 9, 2101378.

Riccardo Frisenda et al., "Recent progress in the assembly of nanodevices and van der Waals heterostructures by deterministic placement of 2D materials", Royal Society of Chemistry, 2018, 47, pp. 53-68.

Sun Yilin et al., "Optically stimulated synaptic transistor based on MoS2/quantum dots mixed-dimensional heterostructure with gate-tunable plasticity", , Optics Letters, vol. 46, No. 7, Mar. 30, 2021, p. 1748, XP093243746, US, ISSN: 0146-9592, DOI: 10.1364/OL. 414820, Retrieved from the Internet: URL: https://opg.optica. org/view_article.cf m?pdfKey=e52f9cfb-bd7d-4d0b-b1f18f4a52da00 41_449700.

Kundu Biswajit et al., "Hybrid 2D-QD MoS2—PbSe Quantum Dot Broadband Photodetectors with High-Sensitivity and Roo••Temperature Operation at 2.5 μm", Advanced Optical Materials, vol. 9, No. 22, Sep. 12, 2021, pp. 1-7, H10K XP093200637, DE, ISSN: 2195-1071, DOI: 10.1002/dom.202101378, Retrieved from the Internet: URL:https://onlinelibrary.wiley.com/doi/full-XML/10.1002/dom.202101378.

Chao Hu et al., "Synergistic Effect of Hybrid PbS Quantum Dots/ 2D-WSe2 Toward High Performance and Broadband Phototransistors", Advanced Functional Materials, Wiley—V CH Verlag GMBH & Co. Kgaa, DE, vol. 27, No. 2, Nov. 16, 2016, XP072412366, ISSN: 1616-301X, DOI: 10.1002/ ADFM.201603605.

Zhang Jing-Yue et al., "Toward Broadband Imaging: Surface-Engineered PbS Quantum Dot/ Perovskite Composite Integrated Ultrasensitive Photodetectors", Applied Materials & Interfaces, vol. 11, No. 47, Nov. 4, 2019, p. 44430-44437, XP093243959, US, ISSN: 1944-8244, DOI: 10.1021/acsami.9b14645.

Chin Patrick, "European Search Report for EP Application No. 24195527.7", Feb. 18, 2025, EPO, Germany.

\* cited by examiner

OPTOELECTRONIC SYNAPTIC DEVICE INCLUDING QUANTUM DOT(QD)-TRANSITION METAL CHALCOGENIDE(TMD) HETEROJUNCTION

CROSS-REFERENCE TO RELATED APPLICATIONS

This application claims priority from Korean Patent Application No. 10-2023-0151914, filed on Nov. 6, 2023, in the Korean Intellectual Property Office, which is incorporated herein by reference in its entirety.

BACKGROUND OF THE INVENTION

Field of the Invention

The present invention relates to an optoelectronic synaptic device, and more specifically, to an optoelectronic synaptic device provided with a photoactive layer including a heterojunction of quantum dots and a transition metal dichalcogenide.

Background of the Related Art

Research on autonomous driving has begun in the 1970s, and with the emergence of deep learning technology, techniques thereof are developed rapidly in the 2010s. While passing through the COVID-19 era, techniques related to the autonomous driving are developed more rapidly. In order to respond to 'artificial intelligence' and 'safety', which are core techniques of the smart mobility industry in the future, maximized is the importance of artificial neural network processing devices equipped with a sensing element technique for recognizing lanes and obstacles in front of the vehicle, and a neuromorphic technique for simultaneously performing information processing of recognition-perception-operation in parallel, like the structure and operation of neurons of a human brain, to perform ultra-high-speed information processing such as recognition, determination, control, computation, or the like.

Currently, risk avoidance and autonomous driving functions of mobilities are driven through optical signals (LiDAR, Light Detection and Ranging) or electromagnetic waves (RADAR, Radio Detection and Ranging) detecting dangerous objects. However, although the LiDAR is based on InGaAs and specialized for the 900 nm band, there is a problem in that the recognition rate is lowered as the optical signals overlap with visible light. Therefore, in order to avoid confusion generated by the visible light in a general atmospheric environment and accurately recognize objects, the need of photodetection devices sensitively and quickly responding to infrared wavelength signals of 900 nm or more is also increasing. Furthermore, in order to guarantee safety of passengers and cargos and implement stable autonomous driving, a series of processes such as risk recognition-computation-determination-response should be performed extremely quickly. In addition, in order to improve the efficiency of driving a mobility system, it needs to develop this series of processes in a single device to drive the processes with low power.

SUMMARY OF THE INVENTION

Therefore, the present invention has been made in view of the above problems, and it is an object of the present invention to provide an optoelectronic synaptic device including a photoactive layer, which shows neuromorphic characteristics, while being capable of photo responses of an infrared wavelength, for accurate recognition of objects.

To accomplish the above object, according to one aspect of the present invention, there is provided an optoelectronic synaptic device comprising: a photoactive layer provided on a substrate and including inorganic quantum dots and a two-dimensional semiconductor material; and a plurality of electrodes provided on the photoactive layer and arranged to be spaced apart from each other.

A heterojunction may be formed by directly contacting the inorganic quantum dots and the two-dimensional semiconductor material.

A wavelength of light that can be accepted in the photoactive layer may include a wavelength range of visible to near-infrared light.

The two-dimensional semiconductor material may be a layered type of a monolayer or a multilayer of two or more layers.

The two-dimensional semiconductor material may include a transition metal dichalcogenide.

The transition metal dichalcogenide may be expressed as chemical formula $MX_2$, and M may be a transition metal element and include Mo, W, Nb, V, Ta, Ti, Zr, Hf, Tc, Re, Ru, Co, Pd, Pt, Cu, Ga, In, Sn, Ge, Pb, or a combination of two or more selected from these elements, and X may be a chalcogen element and include S, Se, Te, or a combination of two or more selected from these elements.

The transition metal dichalcogenide may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PdTe_2$, or a combination of two or more selected from these elements.

The inorganic quantum dots may have a band gap of 1.2 eV or lower.

The inorganic quantum dots may include InAs, PbS, CdS, GaAs, InGaAs, InP, GaInP, or a combination of two or more selected from these elements.

The electrode may include a metal or a metal compound, and the metal or the metal compound may include a metal element including Ti, Ni, Cr/Au, Ag, or a combination of two or more selected from these elements.

In addition, in order to accomplish the above object, a method of manufacturing an optoelectronic synaptic device according to a preferred embodiment of the present invention may comprise the steps of: combining a two-dimensional semiconductor material on a silicon oxide substrate; forming a two-dimensional semiconductor material layer by transferring the two-dimensional semiconductor material on another semiconductor substrate; forming an electrode layer by depositing a plurality of metal layers arranged to be spaced apart from each other on a portion of the two-dimensional semiconductor material layer; and forming a photoactive layer by applying an inorganic quantum dot colloidal solution and a ligand solution to some other surfaces on the two-dimensional semiconductor material layer and coating and drying the solutions.

The two-dimensional semiconductor material layer may be a monolayer or a multilayer of two or more layers.

The transfer step may be wet transfer.

The ligand solution is a mixed solution in which an organic ligand and an organic solvent are mixed, and the organic ligand solution may have a short carbon chain or ring of C1 to C8, and include any one or more functional groups selected from a thiol group, an amine group, a carboxyl group, and a combination thereof.

The organic ligand may include a thiol-based ligand such as 1,2-ethanedithiol (EDT), 3-mercaptopropionic acid (MPA), benzenedithiol (BZT), or the like, an amine-based ligand such as ethylenediamine (EDA), ammonium thiocyanate (SCN), or the like, and a combination of at least two or more selected from these elements.

The step of forming a photoactive layer may be performed at room temperature.

DETAILED DESCRIPTION OF THE PREFERRED EMBODIMENT

Figure 1:
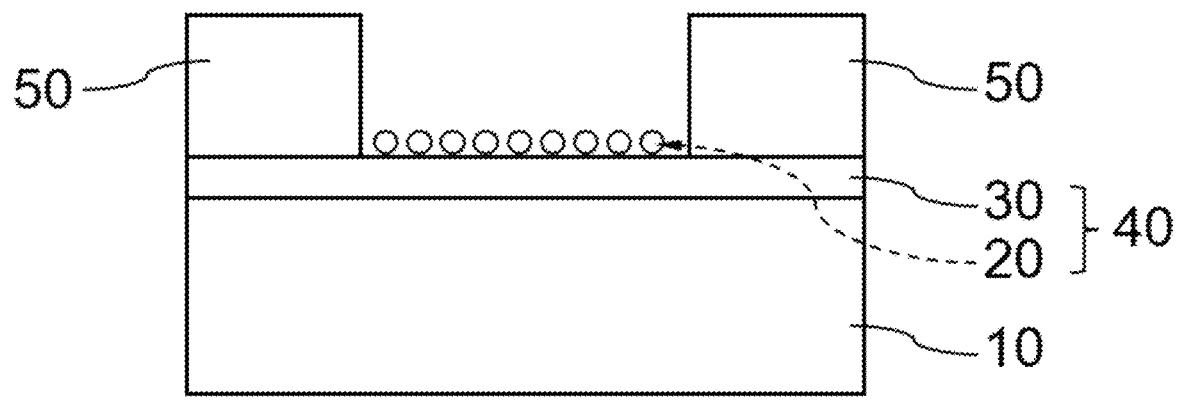
FIG. 1 is a mimetic view showing the cross section of an optoelectronic synaptic device according to an embodiment of the present invention.

Hereinafter, preferred embodiments of the present invention will be described in detail with reference to the accompanying drawings. The advantages and features of the present invention and method for achieving them will become clear by referring to the embodiments described below in detail, together with the accompanying drawings. However, the present invention is not limited to the embodiments disclosed below and can be implemented in various forms different from each other. These embodiments are provided only to make the disclosure of the present invention complete and to fully inform those skilled in the art of the scope of the present invention, and the present invention is defined by the scope of the claims. Like reference numerals refer to like components throughout the specification.

Unless defined otherwise, all the terms (including technical and scientific terms) used in this specification may be used as meanings that can be commonly understood by those skilled in the art. In addition, terms defined in commonly used dictionaries are not interpreted ideally or excessively unless clearly and specifically defined. The terms used in this specification are to describe the embodiments and are not to limit the present invention. In this specification, singular forms also include plural forms unless specifically stated otherwise in the context.

The terms "comprises, includes" and/or "comprising, including" used in this specification do not exclude the presence or addition of one or more components, steps, operations, and/or elements other than the mentioned components, steps, operations, and/or elements.

Optoelectronic synaptic device provided with a photoactive layer including a heterojunction of inorganic quantum dots and a two-dimensional semiconductor material FIG. 1 is a mimetic view showing the cross section of an optoelectronic synaptic device according to an embodiment of the present invention.

Referring to FIG. 1, an optoelectronic synaptic device 100 may include a photoactive layer 40 provided on a substrate 10 and including inorganic quantum dots 20 and a two-dimensional semiconductor material 30; and a plurality of electrodes 50 provided on the photoactive layer 40 and arranged to be spaced apart from each other.

A semiconductor substrate made of a semiconductor material such as silicon, silicon-on-insulator (SOI), or the like may be used as the substrate 10. In addition, a semiconductor substrate with a wide bandgap (WBG), such as silicon carbide (SiC), gallium nitride (GaN), gallium oxide ($Ga_2O_3$), or the like, may also be used as the substrate 10. A substrate additionally doped with a dopant may also be used as the substrate 10.

The electrode 50 may include a metal or a metal compound. The metal or metal compound may include a metal element including Ti, Ni, Cr/Au, Ag, or a combination of two or more selected from these elements, and any type of metal or metal compound including a metal element of a type suitable for being used in electronic devices, such as metal electrodes, metal interconnections, and the like, may be used without limit.

The photoactive layer 40 is a light receiving layer that accepts an applied optical signal and may include inorganic quantum dots 20 and a two-dimensional semiconductor material 30. In particular, as the inorganic quantum dots 20 that accept near-infrared light signals and the two-dimensional semiconductor material 30 that exhibits synaptic characteristics by optical stimulation are in direct contact and form a heterojunction, the photoactive layer 40 may be easily used as a channel layer of an optoelectronic synaptic device capable of responding to optical signals including a near-infrared wavelength.

Specifically, when an infrared optical signal is radiated to the inorganic quantum dot 20 layer of the photoactive layer 40, as charges are excited from the valence band of the quantum dots to the conduction band, and the excited charges may be transferred to the channel layer of the two-dimensional semiconductor material 30 that is in contact with the quantum dots, current may flow through the semiconductor channel layer. At this point, as some of the charges are trapped or de-trapped at the interface between the transition inorganic quantum dots 20 and the two-dimensional semiconductor material 30, conductivity of the semiconductor channel may be reversibly controlled. Through this, as the conductivity of the channel of the two-dimensional semiconductor material 30 is controlled according to application of infrared signals, learning and forgetting characteristics with respect to infrared stimulation may be implemented by variably controlling concentration of trapped charges. In particular, as the optoelectronic synaptic device according to a preferred embodiment of the present invention adopts a vertical heterojunction structure of an infrared-sensitive zero-dimensional material (inorganic quantum dots 20) and a two-dimensional semiconductor material 30 of the semiconductor channel layer, the trap and de-trap behaviors of the charges may be reversibly controlled at the junction interface of the light (infrared) sensitive layer and the semiconductor channel layer, and unlike single material-based neural network devices that do not form a heterojunction structure, higher learning ability can be implemented.

First, the inorganic quantum dots 20 may be a material capable of responding to optical signals, e.g., optical pulses, and absorbing and emitting light in the wavelength range of visible light to the entire near-infrared, e.g., in the wavelength range of 380 to 1500 nm. Particularly, the acceptable wavelength range of the material of the inorganic quantum dots 20 according to a preferred example of the present invention may include a range of near-infrared wavelength, specifically a wavelength range of 800 to 1500 nm, and more specifically 900 to 1200 nm.

The material of the inorganic quantum dots 20 is a zero-dimensional (0D) material and includes homogeneous circular inorganic particles having a nanoscale diameter, and may have a diameter of 0.1 to 10 nm, specifically a diameter of 0.5 to 7 nm, and more specifically, a diameter of 1 to 5 nm, but it is not limited thereto.

In addition, the material of the inorganic quantum dots 20 according to a preferred example of the present invention is a semiconductor material that absorbs and emits light in the near-infrared region, and may be a material with a band gap of 1.2 eV or lower. The material of the inorganic quantum dots 20 may include, for example, InAs, PbS, CdS, GaAs, InGaAs, InP, GaInP, or a combination of two or more selected from these elements, and may include InAs in a specific embodiment, but it is not limited thereto. In particular, as a material of the inorganic quantum dots 20, InAs quantum dots are a semiconductor material capable of absorbing and emitting light in the near-infrared wavelength range and conforming Restriction of Hazardous Substances (RoHS), and may be a material that can easily replace lead-chalcogenide quantum dots containing highly toxic heavy metals, such as PdS CdS, or the like. The InAs quantum dots may mainly exhibit n-type characteristics.

In addition, the inorganic quantum dots 20 may be covered with an organic ligand or the like, which will be described below, for passivation for the sake of charge trap effect.

Meanwhile, for effective light absorption ability, specifically, for infrared light absorption ability of the quantum dots, the inorganic quantum dots 20 may be additionally doped or alloyed, or two or more types of inorganic quantum dots may be composited, and the inorganic quantum dots 20 may be manufactured in a core-shell structure for effective passivation.

Next, the two-dimensional (2D) semiconductor material 30 may have a structure, in which a strong covalent bond is formed within a single layer, and layers are bonded by a relatively small Van der Waals force. Unlike general optoelectronic devices, the two-dimensional semiconductor material 30 is advantageous in that the structure is simple as the channel layer of the optoelectronic device may be directly used with only a single material by making use of its direct transition property.

The two-dimensional semiconductor material 30 may be provided in the form of particles of an ultra-thin film or an ultra-thin plate shape, such as flakes, of a layered structure in the photoactive layer 40, and may be provided as a monolayer or a multilayer of two or more layers. Specifically, the two-dimensional semiconductor material 30 may be provided as a multilayer structure of several layers. Although the two-dimensional semiconductor material 30 exhibits indirect transition characteristics in a bulk state or a thin film state of normal thickness, as it shows direct transition characteristics, excellent photo responsivity, and transparent and flexible characteristics in the case of thickness of a single layer or within a few layers, the two-dimensional semiconductor material 30 may be usefully applied as an optoelectronic device.

In addition, the two-dimensional semiconductor material 30 has a layered structure, in which each layer maintains a very strong covalent bond between constituent atoms, and the layers are bonded by a weak Van der Waals force. Since the two-dimensional semiconductor material 30 does not have dangling bonds extending toward the outside of the layers, and performs only two-dimensional interactions with the constituent atoms in principle, the two-dimensional semiconductor material 30 shows a ballistic transport pattern unlike a thin film or a bulk in which carrier transport is common, and therefore, it can be applied as a high-mobility, high-speed, and low-power semiconductor.

In addition, the two-dimensional semiconductor material 30 may be heterogeneously bonded to various materials due to homogeneous surface characteristics, and through this, it can be applied to a synaptic device of a junction structure form. Particularly, since the two-dimensional semiconductor material 30 is advantageous in that an optoelectronic response that is sensitive even to extremely low optical stimulation is possible due to the layered structure as thin as atomic scale, learning ability of increasing conductivity and characteristics of forgetting due to electrical stimulation can be realized as it sensitively reacts to application of optical stimulation of a pulse form.

The two-dimensional semiconductor material 30 may include a transition metal dichalcogenide (TMD). Specifically, the transition metal dichalcogenide material may be expressed as chemical formula $MX_2$, where M is a transition metal element and may include, for example, Mo, W, Nb, V, Ta, Ti, Zr, Hf, Tc, Re, Ru, Co, Pd, Pt, Cu, Ga, In, Sn, Ge, Pb, or a combination of two or more selected from these elements, and X is a chalcogen element and may include S, Se, Te, or a combination of two or more selected from these elements. Specifically, the transition metal dichalcogenide material may include $MoS_2$, $MoSe_2$, $MoTe_2$, $WS_2$, $WSe_2$, $WTe_2$, $ZrS_2$, $ZrSe_2$, $HfS_2$, $HfSc_2$, $NbSc_2$, $ReSe_2$, $PdTe_2$, or a combination of two or more selected from these elements. More specifically, the transition metal dichalcogenide material may include $MoS_2$, $MoSc_2$, $WS_2$, $WSe_2$, or a combination of two or more selected from these elements, and may include $WSe_2$ in a specific embodiment, but it is not limited thereto.

The crystal structure of the transition metal dichalcogenide material has a covalent bond between M, which is a transition metal, and X, which is a chalcogen element, and based on this, it may have a hexagonal structure in the plane direction. The crystal structure may be changed through an additional phase change step or doping step.

Method of Manufacturing an Optoelectronic Synaptic Device Provided with a Photoactive Layer Including a Heterojunction of Inorganic Quantum Dots and a Two-Dimensional Semiconductor Material In the method of manufacturing an optoelectronic synaptic device according to an embodiment of the present invention, first, a step of preparing a two-dimensional semiconductor material on a silicon oxide substrate may be performed.

Specifically, the step of preparing a two-dimensional semiconductor material may use a Chemical Vapor Deposition (CVD) method. This means that the two-dimensional semiconductor material is grown or deposited on the surface of a silicon oxide substrate by setting and heating quartz boats containing a precursor material at regular intervals in a chemical vapor deposition equipment provided with a plurality of, e.g., two, heating zones. However, the step of preparing a two-dimensional semiconductor material is not limited to the method described above, and according to a purpose, those skilled in the art may appropriately adjust or process experiment conditions to manufacture a two-dimensional semiconductor material of desired physical properties or crystal.

Next, a step of forming a two-dimensional semiconductor material layer by transferring the two-dimensional semiconductor material onto another semiconductor substrate may be performed. The semiconductor substrate is a semiconductor substrate of silicon, silicon-on-insulator (SOI), or the like, and may be used as a substrate different from the silicon oxide substrate, which is a bulk insulator described above. In addition, a semiconductor substrate having a wide bandgap (WBG) such as silicon carbide (SiC), gallium nitride (GaN), gallium oxide ($Ga_2O_3$), or the like may also be used. A semiconductor substrate additionally doped with a dopant may also be used.

The two-dimensional semiconductor material layer may directly contact the semiconductor substrate to form a van der Waals junction by the van der Waals force (vdW). Specifically, the bond between the silicon lattice on the surface of the semiconductor substrate and the two-dimensional semiconductor material layer may be formed through bonding by the van der Waals force. It may form a gap that physically and distinctively separate each interface from another, i.e., a van der Waals gap between the semiconductor substrate and the two-dimensional semiconductor material layer, while the atoms in each layer do not intersect to be mixed with or to penetrate each other. Particularly, in the process of manufacturing the two-dimensional semiconductor material layer, a thin film of uniform thickness may be formed while minimizing physical damage to the surface by applying a transfer process, more specifically, a wet transfer process. In addition, as the two-dimensional semiconductor material layer formed by the van der Waals junction is provided, highly reactive dangling bonds on the surface of the semiconductor substrate can be removed, and as the inherent physical properties of the substrate can be preserved, it can be advantageously applied to implementation of high-performance devices.

Thereafter, a step of forming an electrode layer may be performed by depositing a plurality of metal layers arranged to be spaced apart from each other on a portion of the two-dimensional semiconductor material layer. The metal layer may include a metal or a metal compound. For example, referring to FIG. 1 again, metal electrodes 50 are formed on both sides of the two-dimensional semiconductor material 30 layer, and inorganic quantum dots 20 described below may be formed in the opening where the metal electrodes 50 are not formed. The metal or metal compound may include a metal element including Ti, Ni, Cr/Au, Ag, or a combination of two or more selected from these elements, and any type of metal or metal compound including a metal element of a type suitable for being used in electronic devices, such as metal electrodes, metal interconnections, and the like, may be used without limit.

The manufacturing method may include a step of forming a photoactive layer by applying an inorganic quantum dot colloidal solution and a ligand solution to some other surfaces on the two-dimensional semiconductor material layer and the opening described above, and coating and drying the solutions.

The inorganic quantum dots may be the same as the inorganic quantum dots 20 used in the optoelectronic synaptic device provided with a photoactive layer including a heterojunction of inorganic quantum dots and a two-dimensional semiconductor material described above.

The ligand solution may be a mixed solution in which an organic ligand and an organic solvent are mixed. The organic ligand has a short carbon chain or ring of C1 to C8 for effective passivation of the inorganic quantum dots, and may include any one or more functional groups selected from a thiol group, an amine group, a carboxyl group, and a combination thereof. Specifically, the organic ligand may include a thiol-based ligand such as 1,2-ethanedithiol (EDT), 3-mercaptopropionic acid (MPA), benzenedithiol (BZT), or the like, an amine-based ligand such as ethylenediamine (EDA), ammonium thiocyanate (SCN), or the like, and a combination of at least two or more selected from these elements. Although the organic ligand may use 1,2-ethanedithiol (EDT) in a specific embodiment, it is not limited thereto.

The photoactive layer is a channel layer of an optoelectronic device capable of responding to near-infrared wavelength light and may include a heterojunction formed as the inorganic quantum dots and the two-dimensional semiconductor material directly contact each other. The two-dimensional semiconductor material may be heterogeneously bonded to the inorganic quantum dots with ease due to homogeneous surface characteristics, and through this, it can be applied to a synaptic device of a junction structure form of 0-dimensional (0D) to two-dimensional (2D) materials. Particularly, since the two-dimensional semiconductor material 30 is advantageous in that an optoelectronic response that is sensitive even to extremely low optical stimulation is possible due to the layered structure as thin as atomic scale, learning ability of increasing conductivity and characteristics of forgetting due to electrical stimulation can be realized as it sensitively reacts to application of optical stimulation of a pulse form.

Hereinafter, the present invention will be described in more detail using embodiments and comparative examples. However, the embodiments and comparative examples described below are only for illustrative purpose, and the scope of the present invention is not limited thereto.

Manufacturing Example: Step of Combining $WSe_2$

To combine tungsten diselenide ($WSe_2$), a chemical vapor deposition (CVD) equipment provided with two heating zones is used. First, silicon oxide ($SiO_2$) is used as a substrate, and a quartz boat containing 480 mg of selenium (Se, 99.5% Sigma-Aldrich) powder is placed in a primary heating furnace, and a quartz boat containing mixed powders of 40 mg of NaCl (99%, Sigma-Aldrich) and 240 mg of tungsten oxide (WO3, 99.9%, Sigma-Aldrich) is placed in a secondary heating furnace. Then, while the distance between the two quartz boats is set to 34 cm, Se and $WO_3$/NaCl are grown in the first heating furnace at a temperature rise rate of 10.9° C./min and a growth temperature of 600° C. and in the secondary heating furnace at a temperature rise rate of 14.5° C./min and a growth temperature of 600° C. In the combining step, the flow rates of Ar and H2 gas as carrier gases are 100 sccm and 20 sccm, respectively, and after the combining step is completed, a $WSe_2$ layer of a multilayer flake form with a thickness of about 50 to 70 nm is finally obtained through natural cooling.

Embodiment: Manufacturing an Optoelectronic Synaptic Device Including a QD/WSe$_2$ Heterojunction as a Photoactive Layer WSe$_2$ prepared in the method of Manufacturing Example 1 is transferred onto a silicon/silicon oxide (Si/SiO$_2$) substrate to be used as a photoactive layer. Then, 50 nm of nickel (Ni) is deposited using an e-beam evaporator to form a metal electrode. As a result, a plurality of electrode layers spaced apart from each other and stacked on WSe$_2$, i.e., a metal (Ni) electrode having a WSe$_2$/Ni interface, is manufactured. Next, an InAs quantum dot colloidal solution is applied to the WSe$_2$ photoactive layer of the opening where the metal electrode is not formed, and after spin coating is performed at 2,000 rpm for 30 seconds, a ligand solution EDT (1,2-ethane dithiol) is dropped, and it is left for 30 seconds. Thereafter, a process of rotating at 2,000 rpm for 30 seconds and applying an acetonitrile solution (2,000 rpm for 5 seconds) is repeated twice. Finally, it is rotated at 2,000 rpm for 30 seconds and baked at 150° C. for 30 minutes in the vacuum.

Comparative Example: Manufacturing an Optoelectronic Synaptic Device Including WSe$_2$ as an Optical Signal Reception Unit An optoelectronic synaptic device is manufactured in the same manner as shown in the above example, except that the InAs quantum dot colloidal solution is not applied on the WSe$_2$ photoactive layer.

Figure 2A:
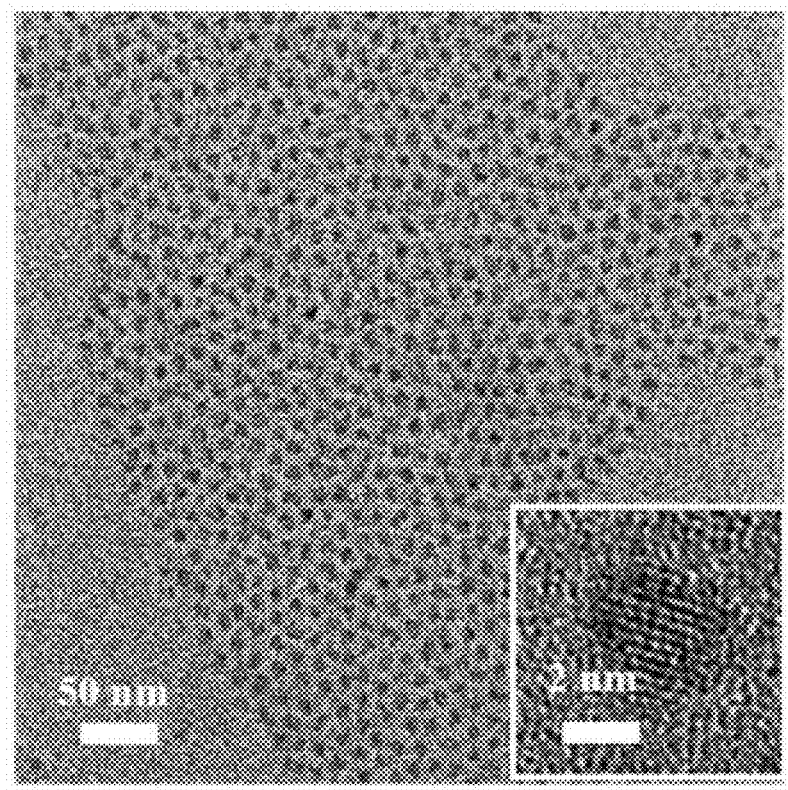
FIGS. 2A and 2B show (a) a transmission electron microscope (TEM) picture and (b) an XRD graph of inorganic quantum dots included in a photoactive layer of an integrated structure for detecting optical signals according to an embodiment of the present invention.
Figure 2B:
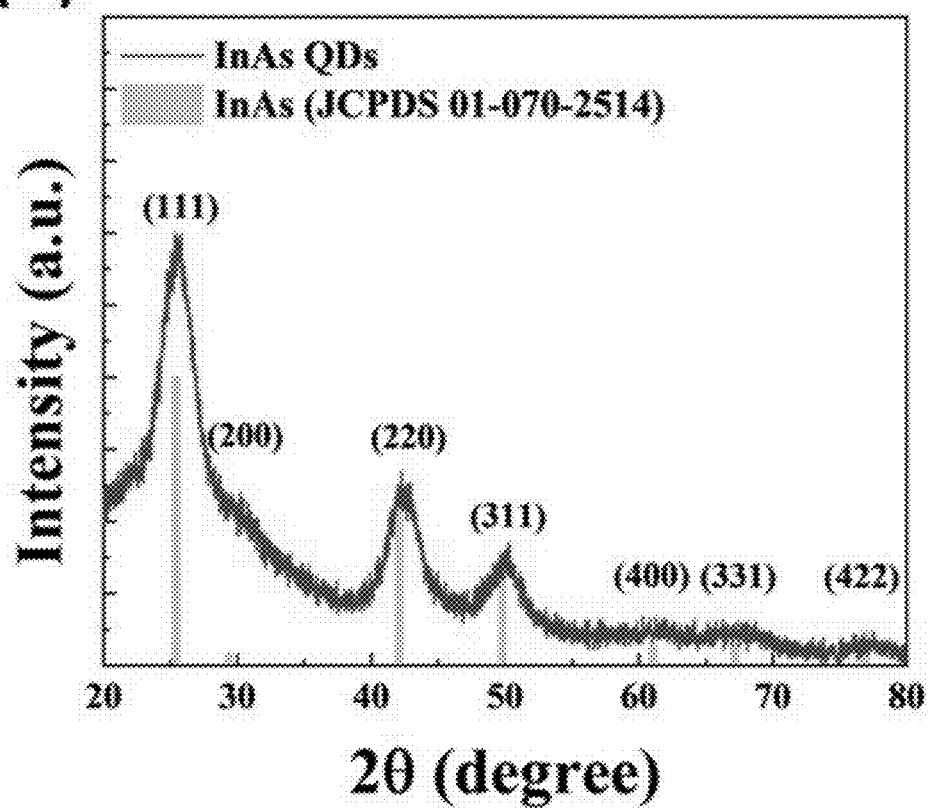
Figure 3A:
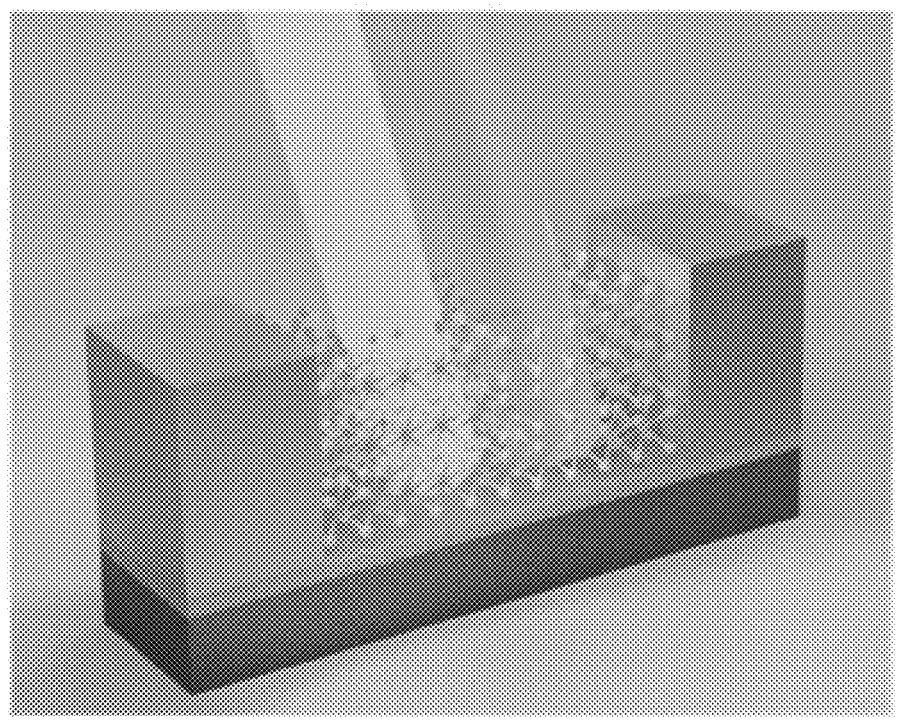
FIGS. 3A, 3B, 3C, and 3D show (a) a mimetic view, (b) responsivity and detectivity according to laser output of 1060 nm wavelength, and (c, d) I-V graphs of an optoelectronic synaptic device according to an embodiment of the present invention.
Figure 3B:
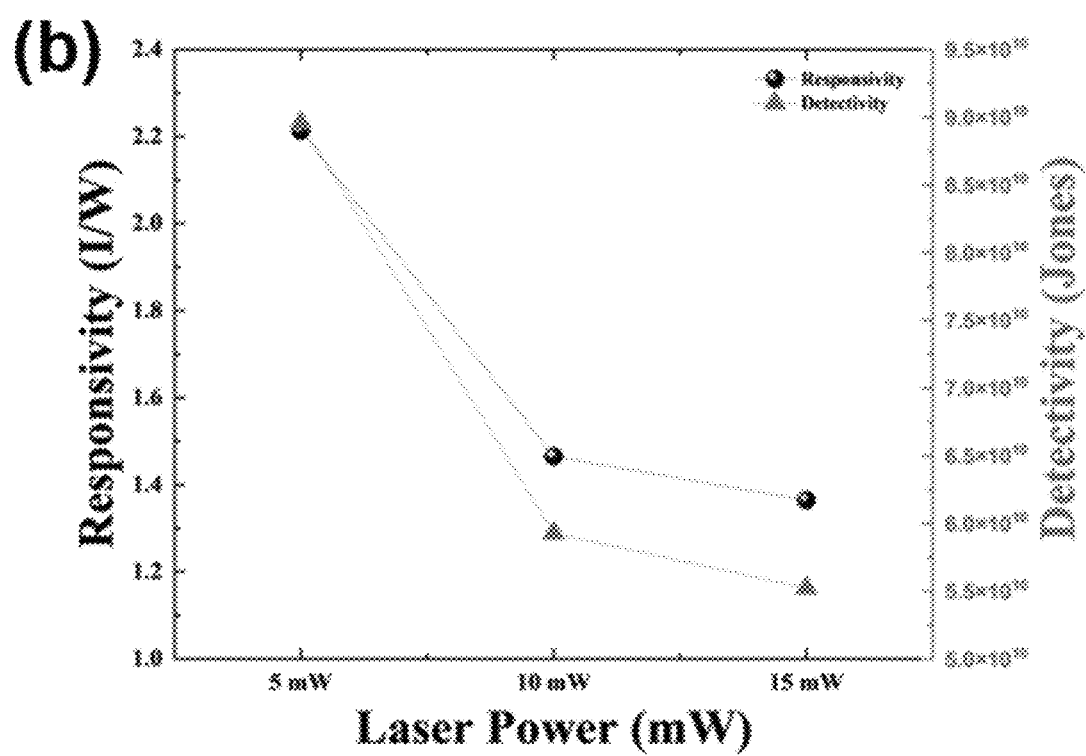
Figure 3C:
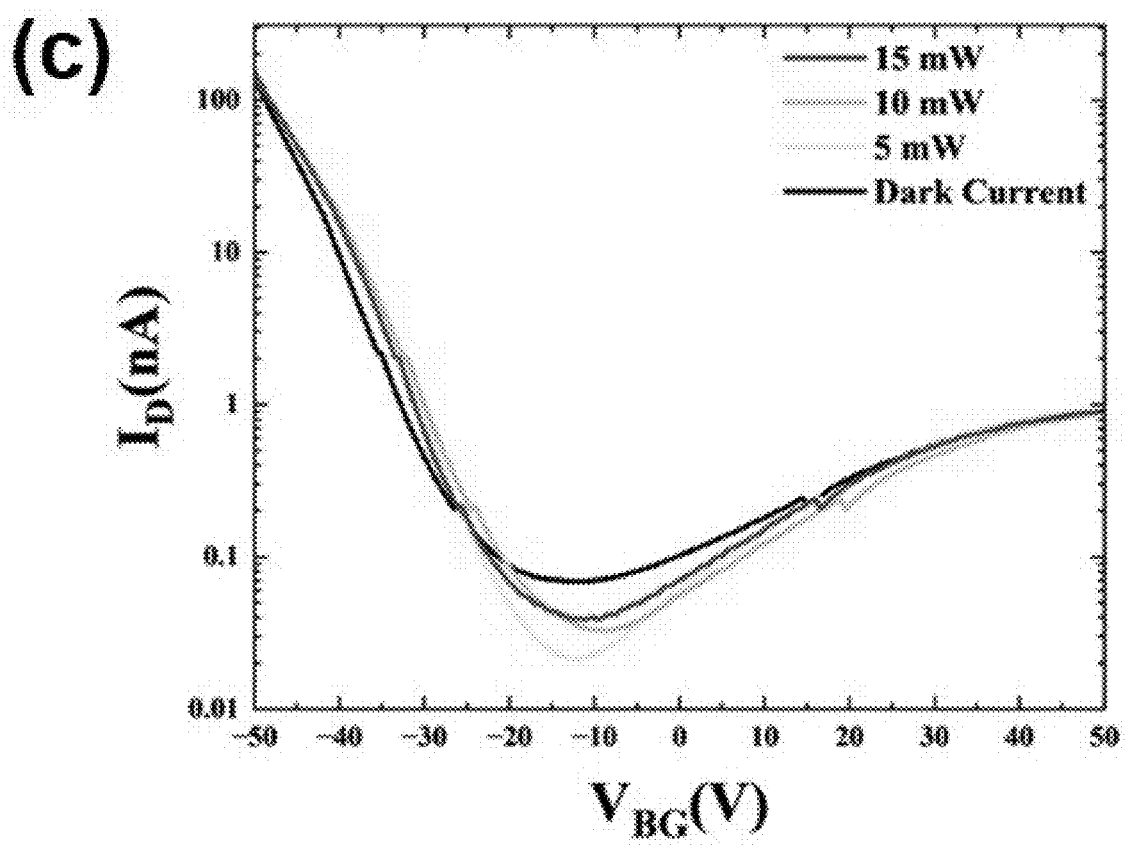
Figure 3D:
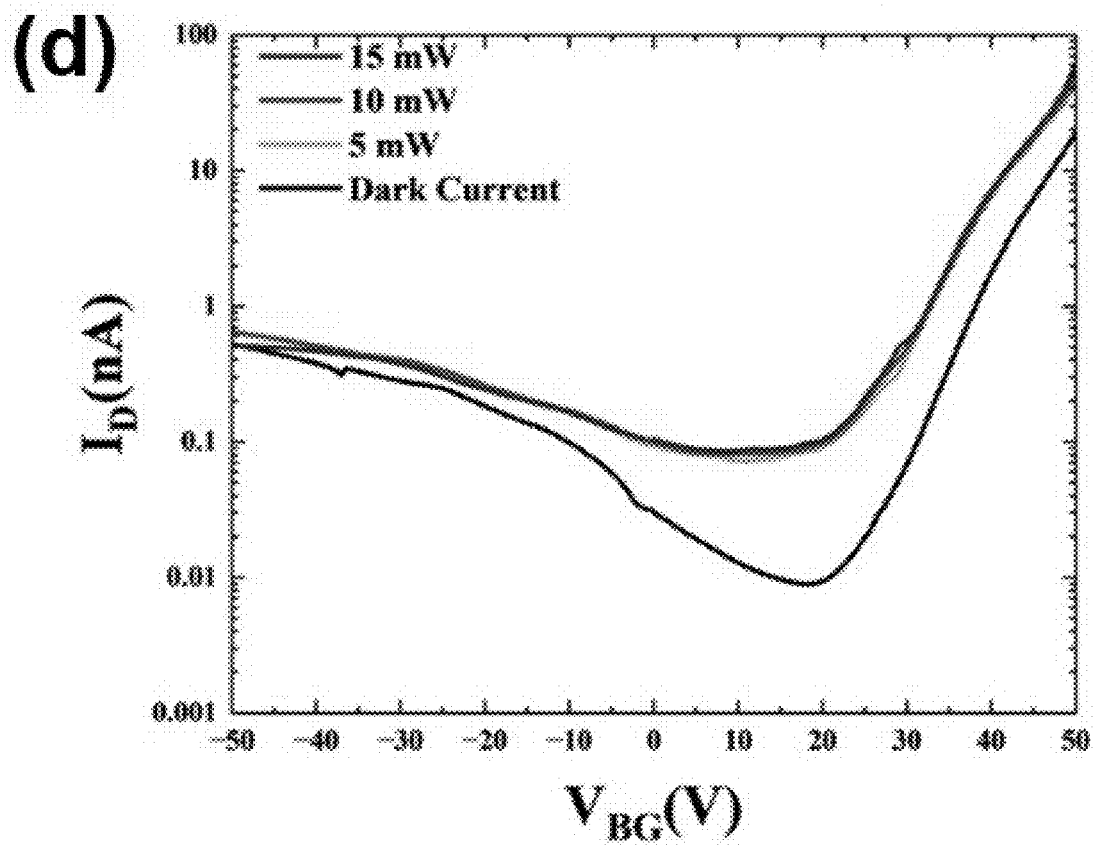
Figure 4A:
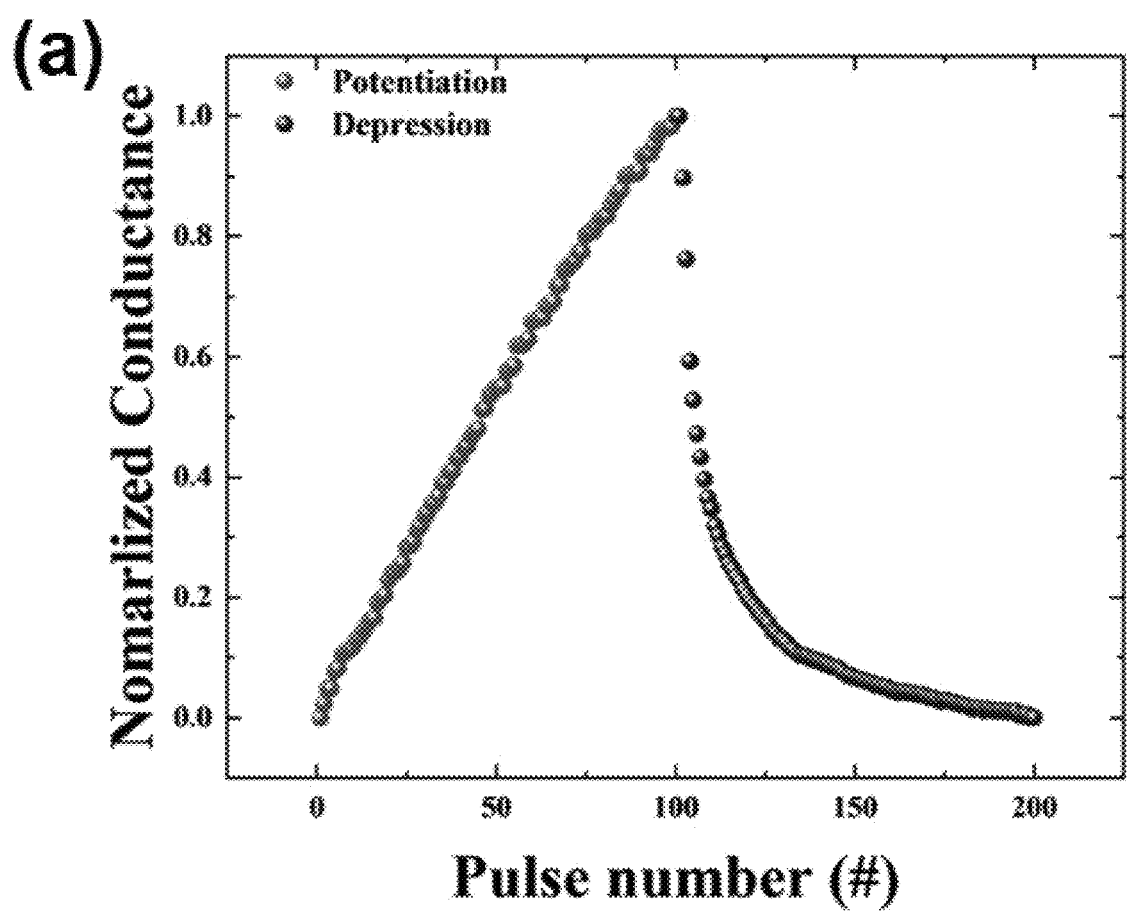
FIGS. 4A, 4B, 4C, 4D, 4E, and 4F show (a, d) conductance according to the number of pulses, (b, c) PPF index, (e) nonlinearity according to presence or absence of a heterojunction of quantum dots and a two-dimensional semiconductor according to laser output, and (f) results showing synaptic weights according to the number of pulses, of an optoelectronic synaptic device according to an embodiment of the present invention.
Figure 4B:
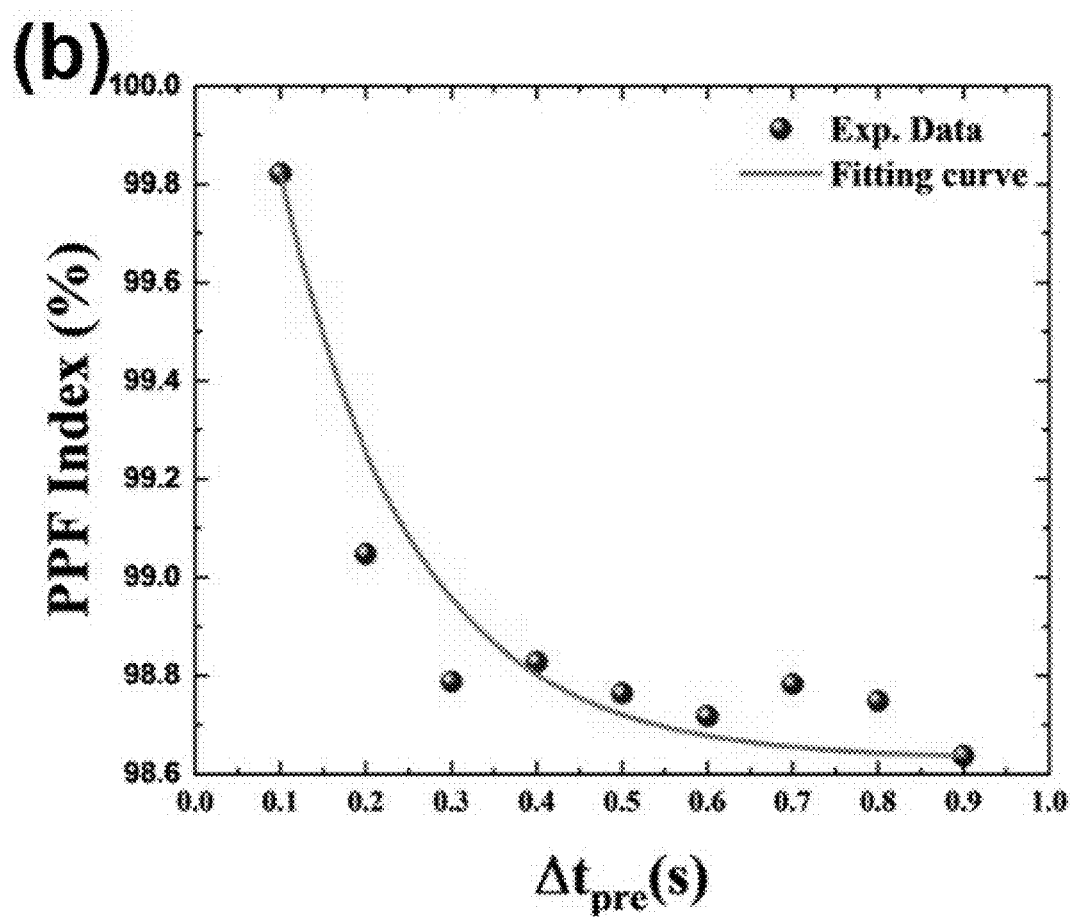
Figure 4C:
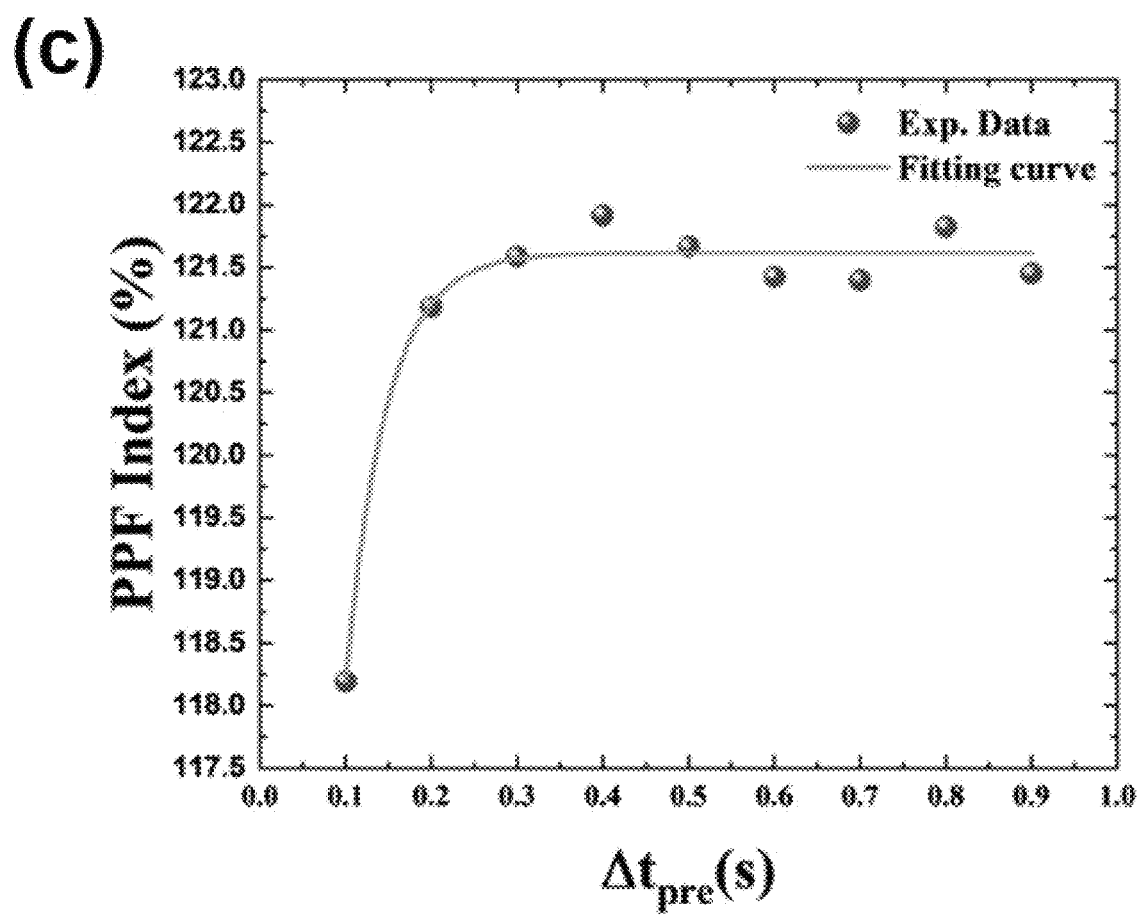
Figure 4D:
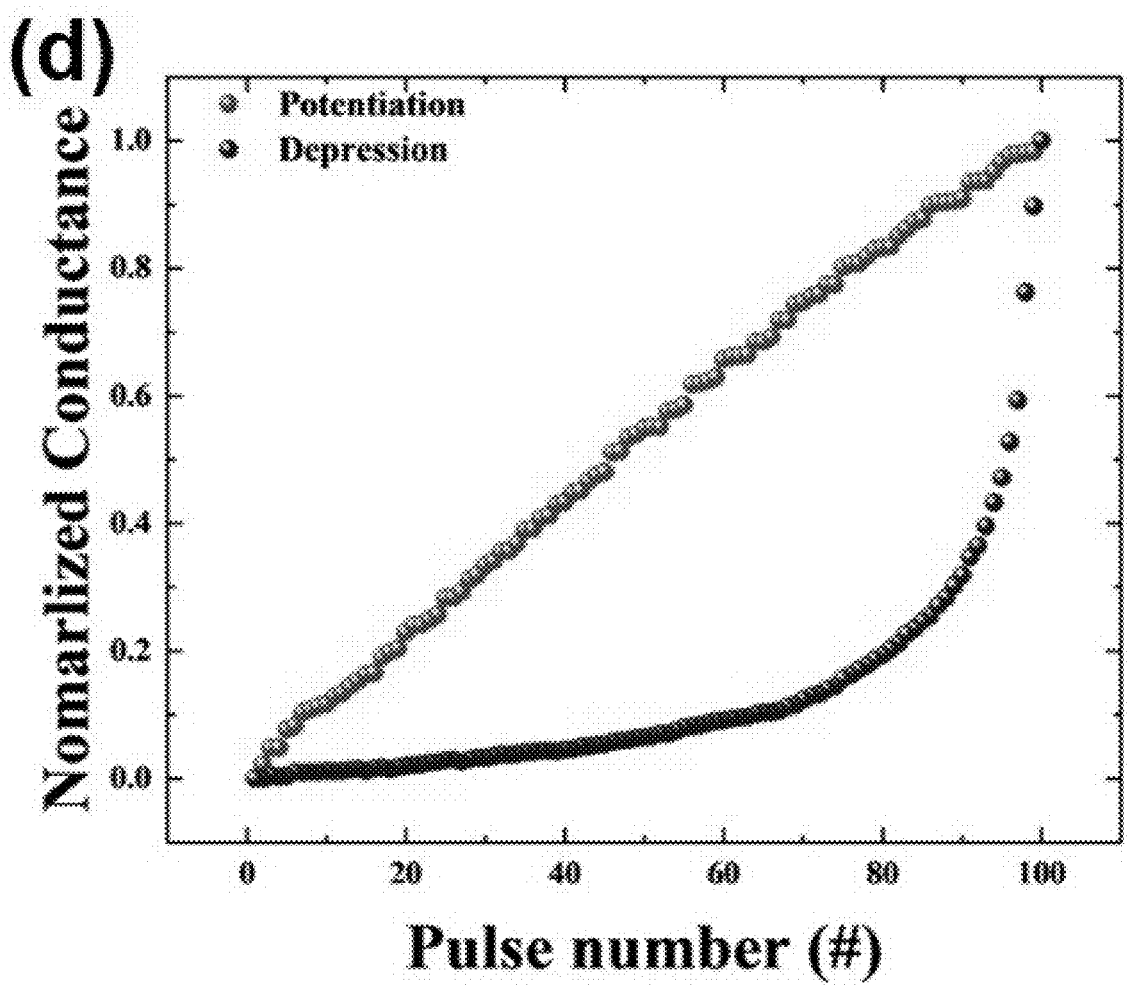
Figure 4E:
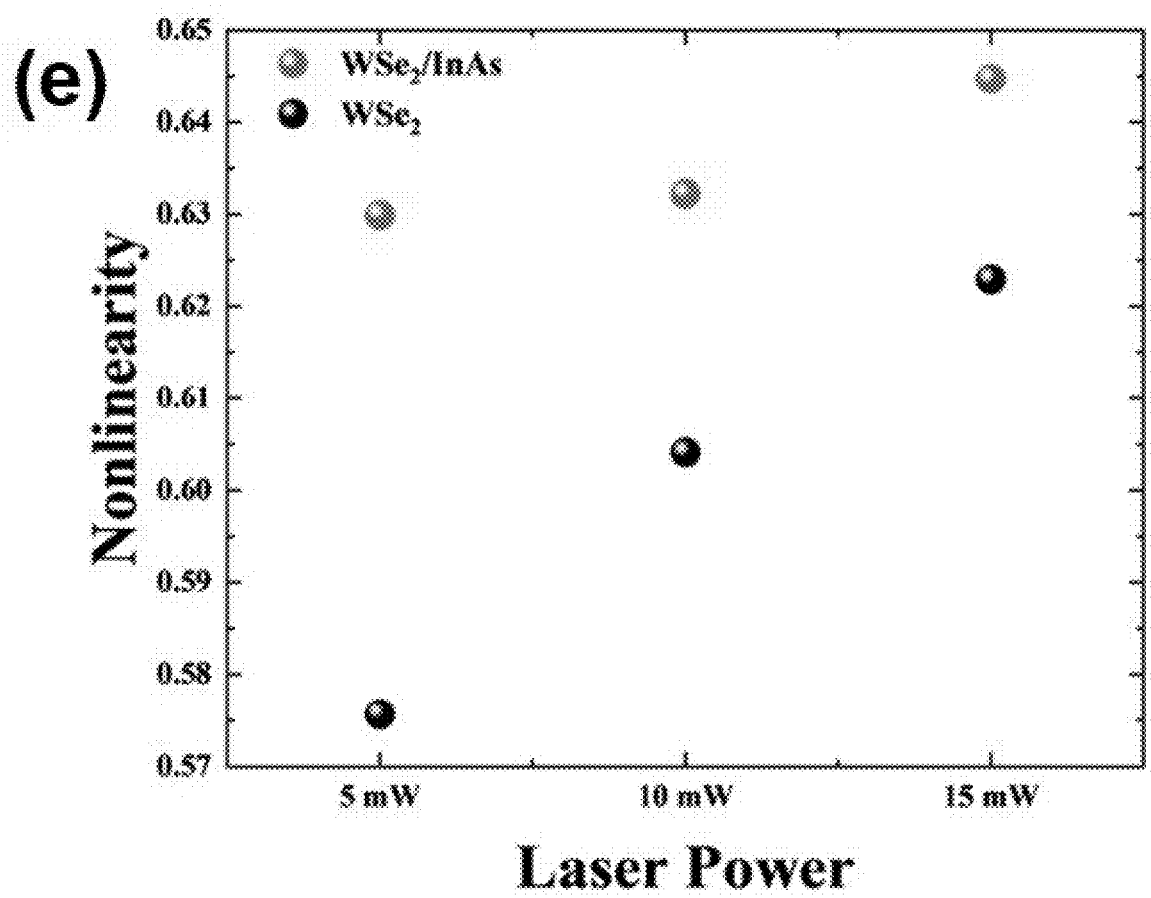
Figure 4F:
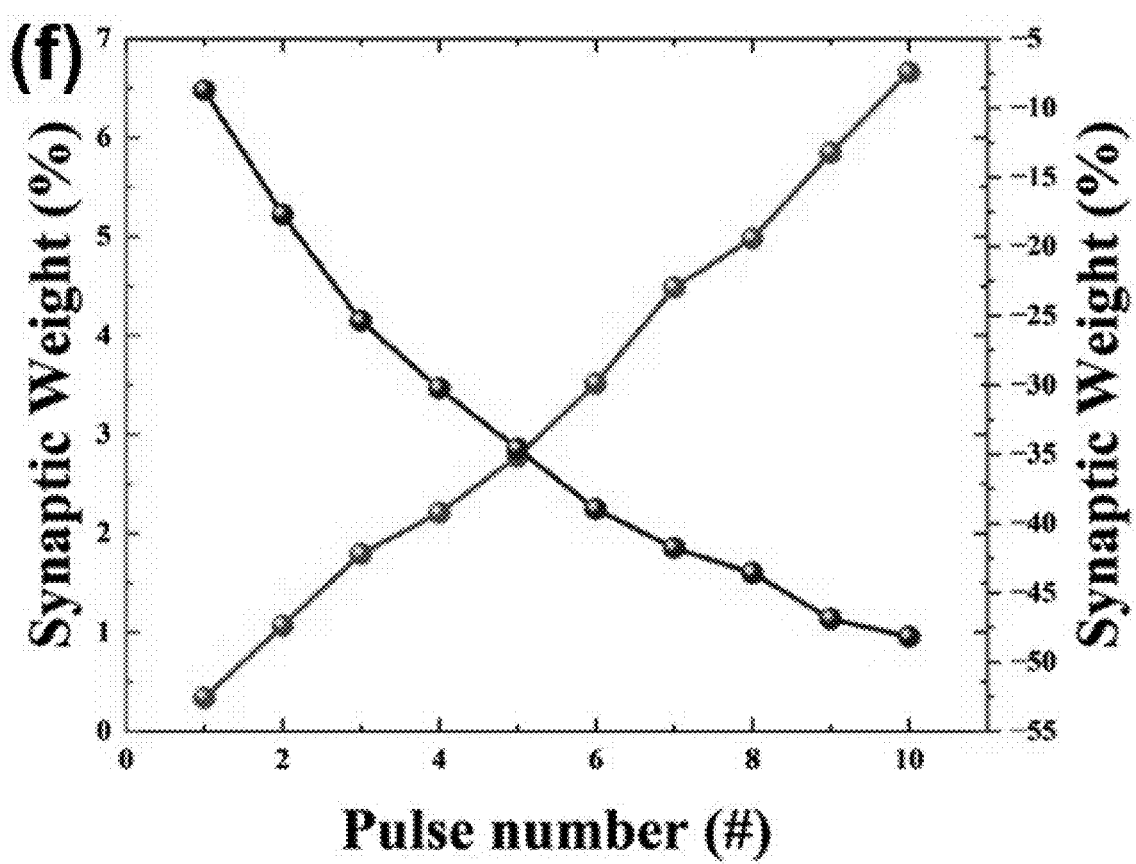

FIG. 2 shows (a) a transmission electron microscope (TEM) picture and (b) an XRD graph of inorganic quantum dots included in a photoactive layer of an integrated structure for detecting optical signals according to an embodiment of the present invention.

Referring to FIG. 2, it can be confirmed that in order to apply the inorganic quantum dots InAs as a photoactive layer, uniform circular particles with a diameter of approximately 3 to 4 nm are prepared as a solution of a colloidal form.

FIG. 3 shows (a) a mimetic view, (b) responsivity and detectivity according to laser output of 1060 nm wavelength, and (c, d) I-V graphs of an optoelectronic synaptic device according to an embodiment of the present invention.

Referring to FIG. 3, it can be confirmed that the dark current characteristic for infrared stimulation is strengthened as a result of confirming responsivity and detectivity as the current in the OFF area of the device is increased after an infrared laser with a wavelength of 1060 nm is applied to the photoactive layer of the optoelectronic synaptic device.

FIG. 4 shows (a, d) conductance according to the number of pulses, (b, c) PPF index, (e) nonlinearity according to presence or absence of a heterojunction of quantum dots and a two-dimensional semiconductor according to laser output, and (f) results showing synaptic weights according to the number of pulses, of an optoelectronic synaptic device according to an embodiment of the present invention.

Referring to FIG. 4, it can be confirmed that the learning (potentiation) and forgetting (depression) characteristics are implemented by applying an infrared laser with a wavelength of 1060 nm to the photoactive layer of the optoelectronic synaptic device. In addition, it can be confirmed that neuromorphic technology can be implemented by implementing spike timing-dependent plasticity (STDP), EPSC, IPSC, and PPF and forgetting characteristics of information consuming less power. Furthermore, the possibility of the optoelectronic synaptic device of the present invention for being an in-sensor computing device capable of signal recognition-processing-operation in a single device can be confirmed.

The transfer and output characteristics are measured using a probe station (M5VC, MS TECH) and a laser oscillator. At this point, it is confirmed that the InAs/WSe$_2$ device generates N-type characteristics compared to the existing WSe$_2$ device of P-type characteristics. As a result of examining the responsivity and detectivity under a 1060 nm wavelength, 2.2 A/W and $9.0 \times 10^{10}$ Jones are measured, respectively. Thereafter, it can be confirmed that when a single pulse is radiated, the photo response current shows a response characteristic improved by about 60% compared to the comparative example (marked as WSe$_2$).

Neuromorphic characteristics are measured to confirm the possibility of using a visual sensor that mimics human retina through the InAs/WSe$_2$ heterojunction structure. It is conformed that when pulses are repeated 100 times using visible and infrared laser wavelengths of 405 nm and 1060 nm, respectively, at 0.5, 1, 2, 3 mW and 5, 10, 15 mW, respectively, through a frequency of 0.5 Hz, learning (potentiation) and forgetting (depression) characteristics are revealed, and as a result of analyzing nonlinearity characteristics based on this, it is confirmed that neuromorphic characteristics are increased by 5% compared to the existing WSe$_2$ device. In addition, possibility of neural mimicry is confirmed through revelation of paired pulse facilitation (PPF) and paired pulse depression (PPD).

Figure 5A:
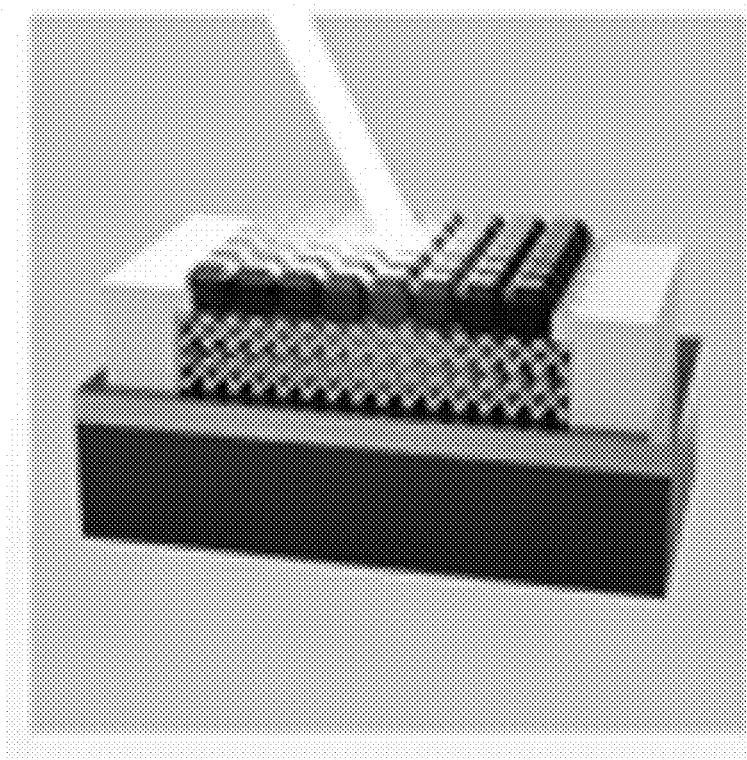
FIGS. 5A, 5B, and 5C show (a) a mimetic view, (b) an IV graph according to light ON/OFF, and (c) a graph measuring the learning (potentiation) and forgetting (depression) characteristics according to application of light pulses, of an optoelectronic synaptic device according to an embodiment of the present invention.
Figure 5B:
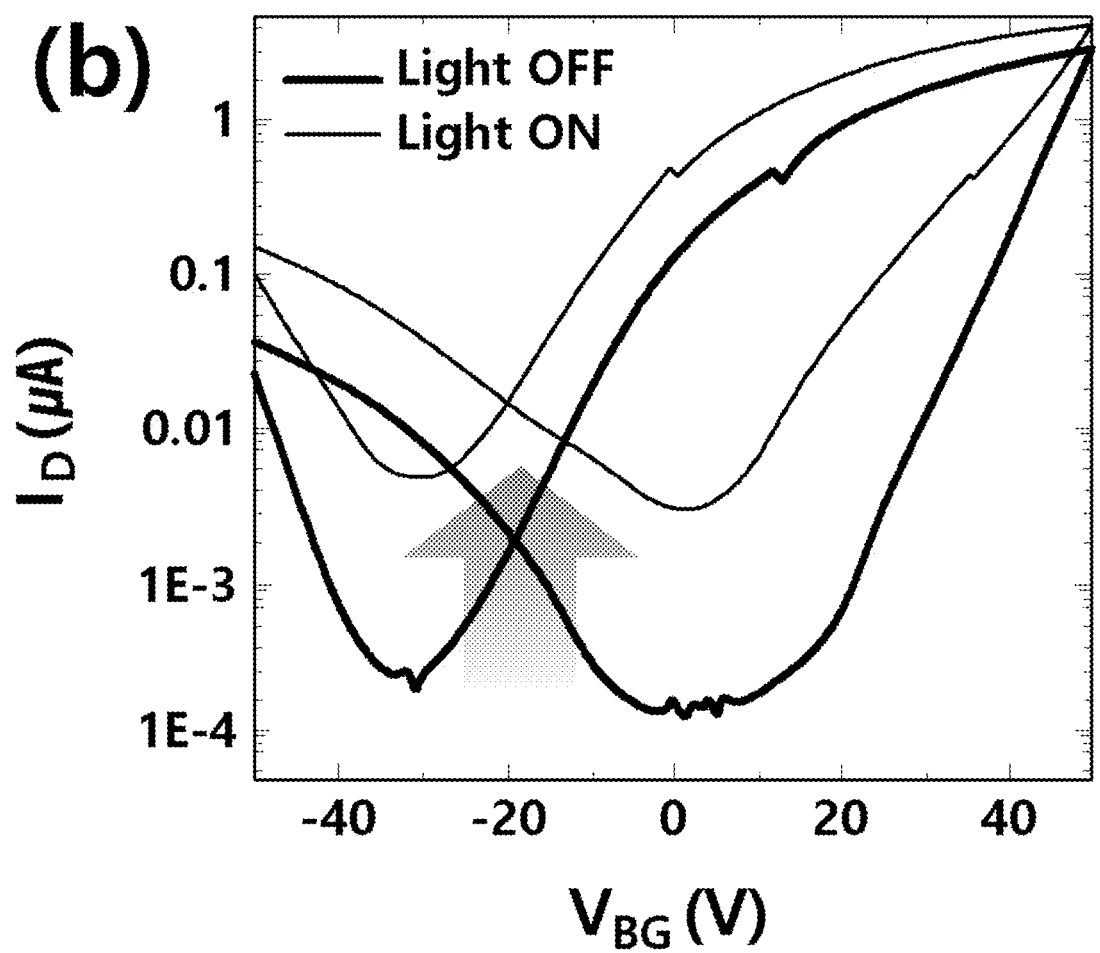
Figure 5C:
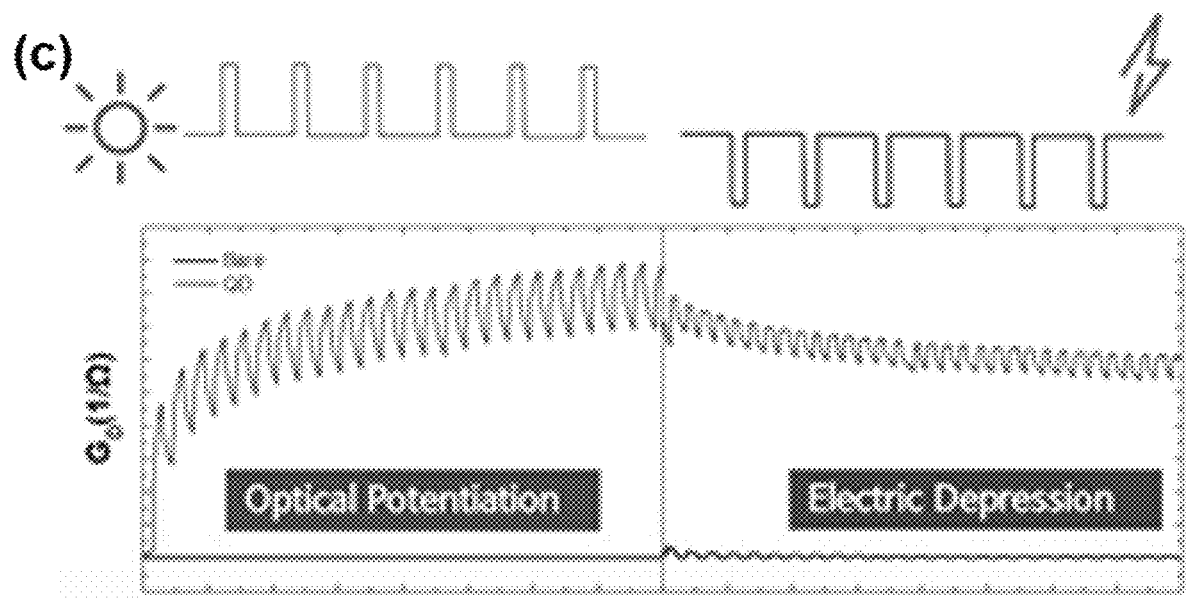

FIG. 5 shows (a) a mimetic view, (b) an IV graph according to light ON/OFF, and (c) a graph measuring the learning (potentiation) and forgetting (depression) characteristics according to application of light pulses, of an optoelectronic synaptic device according to an embodiment of the present invention.

Referring to FIG. 5, it can be confirmed that the photosensitivity and plasticity of the synaptic device are improved as light of an infrared wavelength (1060 nm) is applied as a pulse stimulation. After applying visible light to the optoelectronic synaptic device of the present invention in the form of a pulse, conductivity is increased according to application of the pulse, and then plasticity of the synaptic device is observed by demonstrating electrical forgetting (depression) through a back gate. Accordingly, it can be confirmed that the optoelectronic synaptic device of the present invention can implement the characteristics of the visual-brain function simulation technique by confirming the neuromorphic characteristics, together with the visual response generated by the stimulation of light.

According to the present invention described above, as the optoelectronic synaptic device according to a preferred embodiment of the present invention includes a photoactive layer in which a heterojunction is formed as inorganic quantum dots that accept a near-infrared light signal directly contacts a transition metal dichalcogenide as a two-dimensional semiconductor material that exhibits synaptic characteristics, there is an effect of making a synaptic response to an optical signal in the near-infrared wavelength range. Therefore, a function of simulating the human visual-brain function, which shows the neuromorphic characteristics by the photo response (visual response) of the infrared wavelength, together with light detection characteristics sensitively and rapidly responding to an infrared wavelength signal as well as a visible light signal, can be implemented in a single device for the sake of accurate recognition of objects.

The effects of the present invention are not limited to those mentioned above, and also include other effects that are not explicitly mentioned, but can be clearly understood by those skilled in the art, from the description of the entire specification.

Although embodiments of the present invention have been described above with reference to the accompanying drawings, those skilled in the art will understand that the present invention can be implemented in other specific forms without changing its technical spirit or essential features. Therefore, the embodiments described above should be understood in all respects as illustrative and not restrictive.

DESCRIPTION OF SYMBOLS

100: optoelectronic synaptic device
10: substrate
20: inorganic quantum dot
30: two-dimensional semiconductor material
40: photoactive layer
50: electrode

What is claimed is:

1. An optoelectronic synaptic device comprising:
a photoactive layer disposed on a substrate and including inorganic quantum dots and a two-dimensional semiconductor material; and
a plurality of electrodes disposed on the photoactive layer and spaced apart from each other,
wherein the inorganic quantum dots and the two-dimensional semiconductor material directly contact each other to form a heterojunction,
wherein the two-dimensional semiconductor material is a multilayer of two or more layers having a thickness of 50 to 70 nm,
wherein the inorganic quantum dots include InAs having a bandgap of 1.2 eV or lower, the inorganic quantum dots being capable of sensing near-infrared light within a wavelength range of 800 to 1500 nm at 0.5 to 5 mW, and
wherein a responsivity and a detectivity of the optoelectronic synaptic device increase, when a light intensity of the near-infrared light irradiated on the optoelectronic synaptic device decreases.

2. The optoelectronic synaptic device according to claim 1,
wherein the two-dimensional semiconductor material includes a transition metal dichalcogenide.

3. The optoelectronic synaptic device according to claim 2,
wherein the transition metal dichalcogenide has a chemical formula $MX_2$,
wherein the M denotes a transition metal element including Mo, W, Nb, V, Ta, Ti, Zr, Hf, Tc, Re, Ru, Co, Pd, Pt, Cu, Ga, In, Sn, Ge, or Pb, or a combination of two or more selected from the Mo, W, Nb, V, Ta, Ti, Zr, Hf, Tc, Re, Ru, Co, Pd, Pt, Cu, Ga, In, Sn, Ge, and Pb, and
wherein the X denotes a chalcogen element including S, Se, or Te, or a combination of two or more selected from the S, Se, and Te.

4. The optoelectronic synaptic device according to claim 2,
wherein the transition metal dichalcogenide includes $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, or $PdTe_2$, or a combination of two or more selected from the $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and $PdTe_2$.

5. The optoelectronic synaptic device according to claim 1,
wherein each of the plurality of electrodes includes a metal or a metal compound,
wherein the metal or the metal compound includes a metal element including Ti, Ni, Cr/Au, or Ag, or a combination of two or more selected from the Ti, Ni, Cr/Au, and Ag.

6. A method of manufacturing an optoelectronic synaptic device, the method comprising:
combining a two-dimensional semiconductor material on a silicon oxide substrate;
forming a two-dimensional semiconductor material layer by wet-transferring the two-dimensional semiconductor material on another semiconductor substrate;
forming an electrode layer by depositing a plurality of metal layers arranged to be spaced apart from each other on a portion of the two-dimensional semiconductor material layer; and
forming a photoactive layer by applying an inorganic quantum dot colloidal solution and a ligand solution to some other surfaces on the two-dimensional semiconductor material layer and coating and drying the solutions,
wherein a heterojunction is formed by directly contacting the inorganic quantum dots and the two-dimensional semiconductor material layer each other,
wherein the ligand solution is a mixed solution in which an organic ligand and an organic solvent are mixed, and the organic ligand solution has a short carbon chain or ring of C1 to C8, and includes any one or more functional groups selected from a thiol group, an amine group, a carboxyl group, and a combination thereof,
wherein the two-dimensional semiconductor material is a multilayer of two or more layers having a thickness of 50 to 70 nm,
wherein the inorganic quantum dots include InAs having a bandgap of 1.2 eV or lower, the inorganic quantum dots being capable of sensing near-infrared light within a wavelength range of 800 to 1500 nm at 0.5 to 5 mW, and
wherein a responsivity and a detectivity of the optoelectronic synaptic device increase, when a light intensity of the near-infrared light irradiated on the optoelectronic synaptic device decreases.

7. The method according to claim 6,
wherein the inorganic quantum dots include InAs, PbS, CdS, GaAs, InGaAs, InP, or GaInP, or a combination of two or more selected from the InAs, PbS, CdS, GaAs, InGaAs, InP, and GaInP.

8. The method according to claim 6,
wherein the two-dimensional semiconductor material includes a transition metal dichalcogenide.

9. The method according to claim 8,
wherein the transition metal dichalcogenide has a chemical formula $MX_2$,
wherein M denotes a transition metal element including Mo, W, Nb, V, Ta, Ti, Zr, Hf, Tc, Re, Ru, Co, Pd, Pt, Cu, Ga, In, Sn, Ge, or Pb, or a combination of two or more selected from the Mo, W, Nb, V, Ta, Ti, Zr, Hf, Tc, Re, Ru, Co, Pd, Pt, Cu, Ga, In, Sn, Ge, and Pb, and wherein X denotes a chalcogen element including S, Se, or Te, or a combination of two or more selected from the S, Se, and Te.

10. The method according to claim 6,
wherein the organic ligand includes:
a thiol-based ligand including 1,2-ethanedithiol (EDT), 3-mercaptopropionic acid (MPA), or benzenedithiol (BZT);
an amine-based ligand including ethylenediamine (EDA), ammonium thiocyanate (SCN); or
a combination of at least two or more selected from the thiol-based ligand and the amine-based ligand.

11. The method according to claim 6,
wherein the forming of the photoactive layer is performed at room temperature.

12. The method according to claim 6,
wherein the electrode layer includes a metal or a metal compound,
wherein the metal or the metal compound includes a metal element including Ti, Ni, Cr/Au, or Ag, or a combination of two or more selected from the Ti, Ni, Cr/Au, or Ag.

* * * * *